United States Patent
Zheng et al.

[19]

[11] Patent Number: 5,805,505
[45] Date of Patent: Sep. 8, 1998

[54] CIRCUIT AND METHOD FOR CONVERTING A PAIR OF INPUT SIGNALS INTO A LEVEL-LIMITED OUTPUT SIGNAL

[75] Inventors: Hua Zheng; Jeffrey P. Wright, both of Boise, Id.

[73] Assignee: Micron Technology, Inc., Boise, Id.

[21] Appl. No.: 767,181

[22] Filed: Dec. 16, 1996

[51] Int. Cl.$^6$ .............................. G11C 7/00; H03K 17/16
[52] U.S. Cl. ..................... 365/189.05; 326/57; 326/63; 326/68
[58] Field of Search ................ 365/189.05; 326/57, 326/63, 68, 80, 83, 87

[56] References Cited

U.S. PATENT DOCUMENTS

| | | | |
|---|---|---|---|
| 5,278,460 | 1/1994 | Casper | 307/296.5 |
| 5,311,076 | 5/1994 | Park | 365/189.05 |
| 5,317,213 | 5/1994 | Sato et al. | 307/475 |
| 5,361,002 | 11/1994 | Casper | 327/530 |
| 5,414,379 | 5/1995 | Kwon | 326/57 |
| 5,424,982 | 6/1995 | Kato | 365/189.05 |
| 5,432,665 | 7/1995 | Hopkins | 361/18 |
| 5,559,464 | 9/1996 | Orii | 326/81 |

FOREIGN PATENT DOCUMENTS 63-316405  6/1990  Japan .

*Primary Examiner*—David C. Nelms
*Assistant Examiner*—Son Mai
*Attorney, Agent, or Firm*—Seed and Berry LLP

[57] ABSTRACT

A circuit converts first and second input signals having first and second active levels, respectively, into an output signal. The circuit includes first and second input terminals, an output terminal and first and second drive terminals. A first stage of the circuit is coupled to the first input terminal, the first drive terminal and the output terminal. The first stage couples a first impedance between the first drive terminal and the output terminal when the first input signal is at the first active level, and reduces the magnitude of the first impedance for a first predetermined time after the first input signal transitions to the first active level. A second stage is coupled to the second input terminal, the second drive terminal and the output terminal, and couples a second impedance between the second drive terminal and the output terminal when the second input signal is at the second active level. The second stage may reduce the magnitude of the second impedance for a second predetermined time after the second input signal transitions to the second active level.

28 Claims, 6 Drawing Sheets

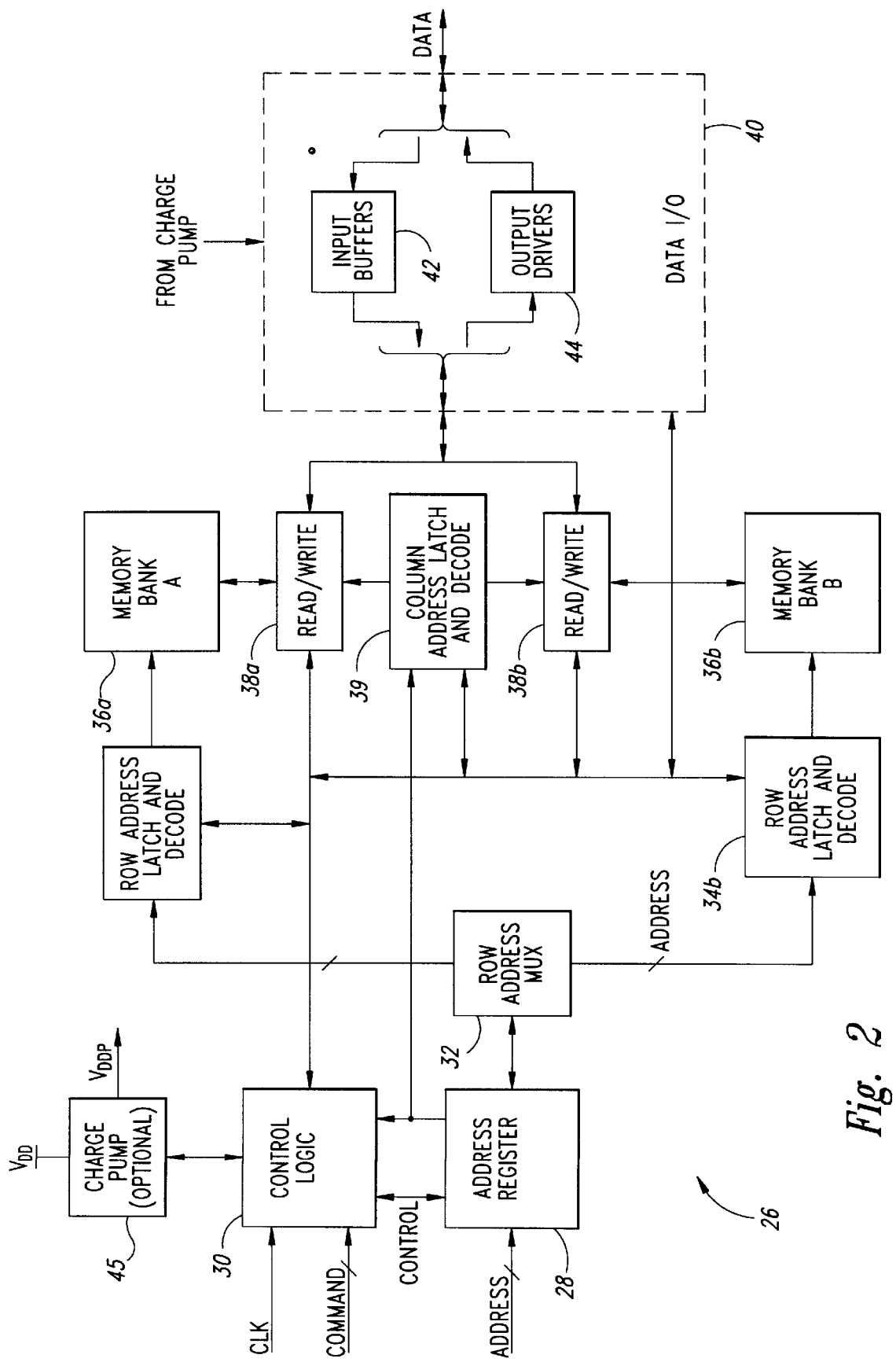

5,805,505

CIRCUIT AND METHOD FOR CONVERTING A PAIR OF INPUT SIGNALS INTO A LEVEL-LIMITED OUTPUT SIGNAL

TECHNICAL FIELD

The present invention relates generally to electronic devices, and more particularly to a circuit and a method for converting first and second input signals having first and second active levels into an output signal having first and second voltage levels that are significantly below the high power-supply rail and above the low power-supply rail, respectively.

Background of the Invention

To keep up with the demand for faster computers and computing circuitry, engineers are working to design new integrated devices, such as processors and memories, that will transfer and manipulate data faster than their predecessors. One circuit that often limits the speed of existing integrated devices is the circuit that drives device output signals onto the external pins of the devices, and thus onto the signal lines to which the external pins are connected.

FIG. 1 is a schematic diagram of a driver circuit 10, which is used in many existing integrated devices to drive a bi-level signal, such as a data signal, onto an external pin of such a device. The driver circuit 10 includes a first input terminal 12 that receives a first input signal $IN_1$, a second input terminal 14 that receives a second input signal $IN_2$, an output terminal 16 (which may be an external pin of a device), a first supply terminal 18, and a second supply terminal 20. A first switch 22 has a control terminal coupled to the input terminal 12, a first switch terminal coupled to the first supply terminal 18, and a second switch terminal coupled to the output terminal 16. A second switch 24 has a control terminal coupled to the input terminal 14, a first switch terminal that is coupled to the output terminal 16, and a second switch terminal that is coupled to the second supply terminal 20. In many such driver circuits 10, the switch 22 is a p-channel MOS transistor and the switch 24 is an n-channel MOS transistor.

In operation, when it is desired that the circuit 10 provide no signal, i.e., a tri-state level, on the output terminal 16, the signal $IN_1$ is inactive logic 1, i.e., inactive high, to turn off; i.e., deactivate, the p-channel transistor 22, and the signal $IN_2$ is inactive logic 0, i.e., inactive low, to deactivate the n-channel transistor 24. When it is desired that the circuit 10 provide a logic 1 on the output terminal 16, $IN_1$ is active low and $IN_2$ is an inactive low, the transistor 24 is in an off, i.e., inactive, state, and the transistor 22 is in an on, i.e., active, state. Thus, the active p-channel transistor 22 pulls up, i.e., drives, the output terminal 16 to a voltage that is approximately equal to the first supply voltage $V_{DD}$. When it is desired that the circuit 10 provide a logic 0 on the output terminal 16, $IN_1$ is inactive high and $IN_2$ is active high, the transistor 22 is inactive, and the transistor 24 is active. Thus, the active transistor 24 pulls down, i.e., drives, the output terminal 16 to a voltage level that is approximately equal to ground, i.e., 0 volts.

A problem with such a driver circuit 10 is that it often drives the output signal to voltage levels that are beyond those required to represent a data value. For example, in many existing memory devices that operate with a $V_{DD}$=3.3 volts, a signal level of at least 2.0 volts represents a logic 1, and a signal level of not more than 0.8 volts represents a logic 0. As described above, however, when $IN_1$=$IN_2$=logic 0 to represent a data of value of logic 1 at the output terminal 16, the circuit 10 drives the output terminal 16 to approximately 3.3 volts, which is approximately 1.3 volts above the logic 1 threshold. Likewise, when $IN_1$=$IN_2$=logic 1 to represent a data value of logic 0, the driver circuit 10 drives the output terminal 16 to approximately 0 volts, which is 0.8 volts below the logic 0 threshold. Thus, the device 10 drives the output terminal 16 to the power-supply rails, which are well beyond the data thresholds.

Driving the output signal to voltages beyond the data thresholds reduces the speed at which the driver 10 can provide data. Typically, a parasitic capacitance 25 is coupled to the output terminal 16. The driver 10 must charge and discharge this capacitance to transition the output signal from one logic level to the other. As this capacitance, and the voltage that the circuit 10 drives across it, increase, the speed at which the driver 10 can transition the output signal decreases. That is, the more charge the driver 10 has to provide to and remove from the parasitic capacitance 25, the more time the driver 10 requires to transition the output signal from one level to the other. Referring to the above example, to transition the output signal from logic 1 to logic 0, the driver 10 must remove sufficient charge from the parasitic capacitance 25 to drive the output signal from approximately 3.3 volts to 0.8 volts. The time the driver 10 requires to remove sufficient charge from the parasitic capacitance to reduce the output voltage from 3.3 to approximately 2.1 volts (to allow for 0.1 volt noise margin) is, in effect, "wasted" time, because the logic 1 level can be as low as 2.1. Likewise, to transition the output signal from logic 0 to logic 1, the driver 10 must add sufficient charge to the parasitic capacitance 25 to drive the output signal from approximately 0 to 2.0 volts. The charge period corresponding to the increase in the output signal from 0 to 0.7 volts (0.1 volt noise margin) is also wasted time, because the logic 0 level can be as high as 0.7 volts. Thus, by driving the output signal to the power-supply rails, the charge and discharge times for the parasitic capacitance 25 is at a maximum level, and the transition speed of the output signal and the data throughput are at minimum levels.

SUMMARY OF THE INVENTION

In accordance with one aspect of the present invention, a circuit is provided that converts first and second input signals having first and second active levels, respectively, into an output signal. The circuit includes first and second input terminals that receive the first and second input signals, an output terminal at which is provided the output signal, and first and second drive terminals. A first stage of the circuit is coupled to the first input terminal, the first drive terminal and the output terminal. The first stage couples a first impedance between the first drive terminal and the output terminal when the first input signal is at the first active level, and reduces the magnitude of the first impedance for a first predetermined time after the first input signal transitions to the first active level. A second stage of the circuit is coupled to the second input terminal, the second drive terminal and the output terminal. The second stage couples a second impedance between the second drive terminal and the output terminal when the second input signal is at the second active level.

In accordance with another aspect of the present invention, a circuit is provided that converts first and second input signals that have first and second active levels, respectively, into a level-limited output signal. The circuit includes first and second input terminals that receive the first and second input signals, an output terminal that provides the output signal, and first and second supply terminals. A first stage of the circuit is coupled to the first input terminal, the first supply terminal, and the output terminal, and couples a first impedance between the first supply terminal and the output terminal when the first input signal is at the first active level. The first stage reduces the magnitude of the first impedance for a first predetermined time after the first input signal transitions to the first active level. A second stage of the circuit is coupled to the second input terminal, the second supply terminal, and the output terminal. The second stage couples a second impedance between the second supply terminal and the output terminal when the second input signal is at the second active level. The second stage reduces the magnitude of the second impedance for a second predetermined time after the second input signal transitions to the second active level.

In a related aspect of the invention, the first stage of the circuit includes a first switch that has a control terminal, a first switch terminal that is coupled to the first supply terminal, and a second switch terminal. A second switch has a control terminal coupled to the first input terminal, a first switch terminal coupled to the second switch terminal of the first switch, and a second switch terminal that is coupled to the output terminal. A first load shunts the first switch, and a first timer has an input terminal coupled to the first input terminal, and has an output terminal that is coupled to the control terminal of the first switch. The first timer activates the first switch for the first predetermined time. The second stage of the circuit includes a third switch that has a control terminal coupled to the second input terminal, a first switch terminal coupled to the output terminal, and a second switch terminal. A fourth switch has a control terminal, a first switch terminal that is coupled to the second switch terminal of the third switch, and a second switch terminal that is coupled to the second supply terminal. A second load shunts the fourth switch, and a second timer has an input terminal coupled to the second input terminal, and has an output terminal coupled to the control terminal of the fourth switch. The second timer activates the fourth switch for the second predetermined time.

In another related aspect of the invention, the first stage of the circuit includes a first switch that has a control terminal, a first terminal coupled to the first supply terminal, and a second switch terminal that is coupled to the output terminal. A second switch has a control terminal that is coupled to the first input terminal, a first switch terminal that is coupled to the first supply terminal, and a second switch terminal. A first load is serially coupled between the second switch terminal of the second switch and the output terminal. A first timer has an input terminal that is coupled to the first input terminal, and has an output terminal that is coupled to the control terminal of the first switch. The first timer activates the first switch for the first predetermined time. The second stage includes a third switch that has a control terminal, a first switch terminal coupled to the output terminal, and a second switch terminal that is coupled to the second supply terminal. A fourth switch has a control terminal that is coupled to the second output terminal, a first switch terminal, and a second switch terminal that is coupled to the second supply terminal. A second load is serially coupled between the first switch terminal of the fourth switch and the output terminal. A second timer has an input terminal that is coupled to the second input terminal, and has an output terminal that is coupled to the control terminal of the third switch. The second timer activates the third switch for the second predetermined time.

An advantage provided by one aspect of the present invention is that it reduces the time it takes for the output signal to transition between predetermined data thresholds by limiting the voltage swing of the output signal.

BRIEF DESCRIPTION OF THE DRAWINGS

FIG. 2 is a block diagram of a memory device according to the present invention.

DETAILED DESCRIPTION OF THE INVENTION

Figure 1:
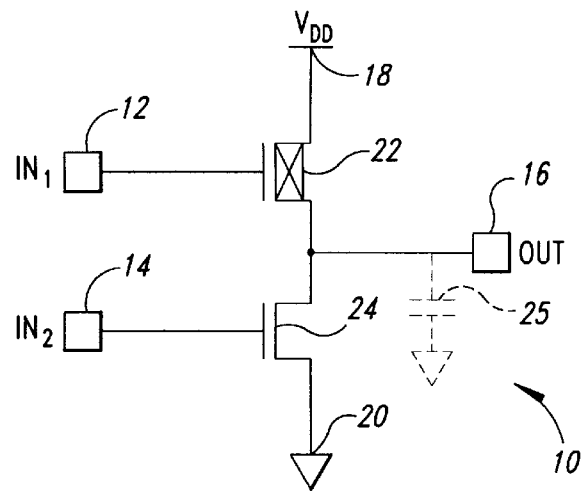
FIG. 1 is a schematic diagram of a known output driver circuit.

FIG. 2 is a block diagram of a memory device 26, which incorporates the present invention. In one aspect of the invention, the memory device 26 is a synchronous dynamic random access memory (SDRAM), although the present invention may be used in other types of memories, and in integrated devices other than memories, such as microprocessors.

The memory device 26 includes an address register 28 that is coupled to an internal address bus ADDRESS, which is coupled to an external address bus via external address pins (not shown). A control logic circuit 30 is coupled to an internal clock line CLK and command bus COMMAND, which are coupled an external clock line and command bus, respectively, via external clock and command pins (not shown). The control logic circuit 30 is also coupled to the address register 28. A row-address multiplexer 32 is coupled to the address register 28 and to row-address latch and decode circuits 34a and 34b, which are both coupled to the control logic 30, and are respectively coupled to the memory banks 36a and 36b. Read/write circuits 38a and 38b are both coupled to the control logic 30, and are respectively coupled to the memory banks 36a and 36b. A column-address latch and decode circuit 39 is coupled to the control logic circuit 30 and to the read/write circuits 38a and 38b. A data input/output (I/O) circuit 40 is coupled to the read/write circuits 38a and 38b, and to an internal data bus DATA, which is coupled to an external data bus via external data pins (not shown). The data I/O circuit 40 includes a plurality of data input buffers 42 and a plurality of data output drivers 44. In one embodiment of the invention, an optional charge pump 45 is coupled to the control logic 30, and may be coupled to other circuits of the memory device 26 as well.

In operation, the control logic circuit 30 receives one or more command signals that indicate that an external device, such as a processor (not shown) wishes to read data from or write data to the memory device 26. During both a read cycle and a write cycle, the address register 28 receives the address of a selected memory cell or group of memory cells in one or both of the memory banks 36a and 36b. The row-address multiplexer 32 provides the address from the address register 28 to the memory banks 36a and 36b via the row-address latch and decode circuits 34a and 34b, respectively. The address register 28 also provides the column address of the selected memory cell or cells to the column-address latch and decoder 39. For clarity, the address register 28, the row address multiplexer 32, the row-address latch and decode circuits 34a and 34b, and the column-address latch and decode circuit 39, can be referred to collectively as the address decoder.

During a write cycle, the control logic 30 controls the read/write circuit 38a or 38b that is respectively connected to the selected memory bank 36a and 36b to couple data from the external data bus, via the internal data bus and the input buffers 42, to the selected memory cell or cells. Likewise, during a read cycle, the control logic 30 controls the appropriate read/write circuit 38a or 38b to respectively couple data from the selected memory bank 36a or 36b to the external data bus via the output drivers 44 and the internal data bus.

If the memory device 26 is a SDRAM, then all of the input signals and output signals are synchronized to the edges of the clock signal on the CLK line. Furthermore, in one aspect of the invention, the power-supply voltage $V_{DD}$=3.3 V, and the data threshold for both logic 1 and logic 0 is 1.4 V. That is, logic 1 is any voltage above 1.4 V, and logic 0 is any voltage below 1.4 V. Additionally, the optional charge pump 45 generates a voltage $V_{DDP}$ that is approximately 1 to 1.5 V greater than $V_{DD}$. $V_{DDP}$ can be used as an overdrive voltage as discussed below.

Figure 3:
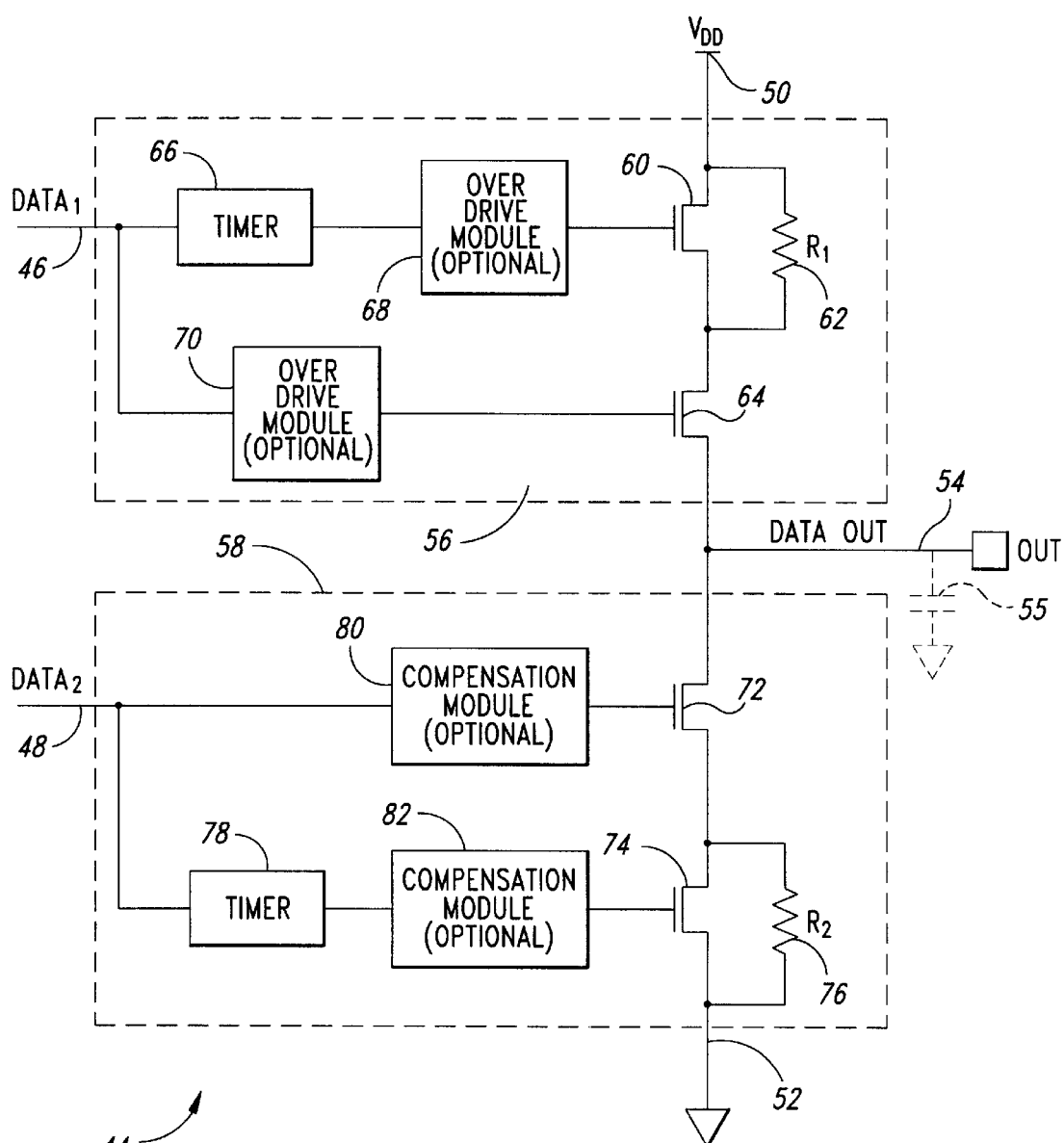
FIG. 3 is a schematic diagram of a first embodiment of an output driver of FIG. 2 according to the present invention.

FIG. 3 is a schematic diagram of one of the data output drivers 44 of FIG. 2. The output driver 44 includes a first input terminal 46 that is coupled to receive a signal $DATA_1$, and a second input terminal 48 that is coupled to receive a signal $DATA_2$. The driver 44 also includes a first supply terminal 50, which in one aspect of the invention is coupled to a first supply voltage $V_{DD}$, and a second supply terminal 52, which in one aspect of the invention is coupled to ground. In one aspect of the invention, $V_{DD}$ is in the range of 3.3 to 6.0 volts (V). The output driver 44 generates the signal DATA OUT on an output terminal 54, which is or is coupled to an external pin of the memory device 26. A capacitance 55 is coupled to the output terminal 54. The capacitance 55 represents the sum of all capacitances, parasitic or otherwise, that are coupled to the output terminal 54. A first stage 56 of the output driver 44 has an input terminal coupled to the first input terminal 46, an output terminal coupled to the output terminal 54, and a power terminal coupled to the first supply terminal 50. A second stage 58 has an input terminal coupled to the second input terminal 48, an output terminal coupled to the output terminal 54, and a power terminal coupled to the second supply terminal 52.

The first stage 56 includes a first switch 60, which has a first switch terminal that is coupled to the first supply terminal 50, a control terminal, and a second switch terminal. A load 62 is coupled in parallel with the switch 60, i.e., across the first and second switch terminals thereof. A second switch 64 has a first switch terminal that is coupled to the second switch terminal of the switch 60, a control terminal, and a second switch terminal that is coupled to the output terminal 54. A timer 66 has an input terminal that is coupled to the first input terminal 46, and an output terminal that is coupled to the control terminal of the first switch 60, preferably through an optional first overdrive module 68. The control terminal of the second switch 64 is coupled to the first input terminal 46, preferably through an optional second overdrive module 70. In one aspect of the invention, the switches 60 and 64 are NMOS transistors, and the load 62 is a resistor having a resistance $R_1$. This resistor may be formed from polysilicon or another material in a conventional manner. The selected value of $R_1$ depends upon considerations that are discussed below.

The second stage 58, which is similar to the first stage 56, includes a third switch 72, which has a first switch terminal coupled to the output terminal 54, a second switch terminal, and a control terminal coupled to the second input terminal 48, preferably through an optional first compensation module 80. A fourth switch 74 includes a first switch terminal that is coupled to the second switch terminal of the switch 72, a control terminal, and a second switch terminal that is coupled to the second supply terminal 52. A load 76 shunts, i.e., is parallel to, the fourth switch 74. A timer 78, which in one aspect of the invention is similar or identical to the timer 66 of the first stage 56, has an input terminal coupled to the second input terminal 48, and an output terminal coupled to the control terminal of the switch 74, preferably through an optional second compensation module 82. In one aspect of the invention, the switches 72 and 74 are NMOS transistors, and the load 76 is a resistor having a resistance $R_2$. In another aspect of the invention, $R_1$ is approximately equal to $R_2$.

In operation, when the circuit 44 lacks the optional modules 68, 70, 80, and 82, and no data is to be provided to the output terminal 54, $DATA_1$ is inactive low, and thus deactivates the switch 64. Likewise, $DATA_2$ is also inactive LOW, and thus deactivates the switch 72. Because the switches 64 and 72 are inactive, the output terminal 54 floats electrically, and DATA OUT equals a tri-state value. Therefore, the driver 44 does not drive a signal onto the output terminal 54.

When the data to be read from the memory device is logic 1, then $DATA_1$ transitions to an active logic 1, and $DATA_2$ transitions to an inactive logic 0. $DATA_1$ activates the switch 64, and the timer 66 activates the switch 60 for a first predetermined time after the transition of $DATA_1$ from an inactive logic 0 to an active logic 1. Thus, during this first predetermined time, both of the switches 60 and 64 are active, and thus provide a low impedance path between the power-supply voltage $V_{DD}$ and the output terminal 54. Because the impedance between $V_{DD}$ and the output terminal 54 is relatively low, a relatively large transition current is available, via the switches 60 and 64, to quickly charge to the logic 1 threshold voltage the capacitance 55. The first predetermined time is preferably sufficient to allow the voltage level of DATA OUT to cross the logic 1 threshold voltage, but not long enough to allow DATA OUT to reach the rail voltage of approximately $V_{DD}$. After the first predetermined time has expired, the timer 66 deactivates the switch 60, and thus causes the load 62 to be serially coupled between $V_{DD}$ and the output terminal 54. The timer 66 is discussed further below in conjunction with FIG. 4.

The load 62, which significantly increases the impedance of the path between $V_{DD}$ and the output terminal 54, limits the voltage level to which the circuit 44 can drive DATA OUT. This voltage level depends both on the impedance value of the load 62 and the current sunk by the external circuitry (not shown) that is coupled to the output terminal 54. Thus, by so limiting the upper voltage level of DATA OUT, the driver 44 reduces the charge on the capacitance 55, and thus can shift DATA OUT from a logic 1 to a logic 0 at an increased speed. In one aspect of the invention, the logic 1 threshold equals 1.4 V and $V_{DD}$=3.3 volts, and the stage 56 limits the logic 1 voltage of DATA OUT to between 1.6 and 2.0 volts. The 0.2 and 0.6 V beyond the 1.4 V threshold provides a noise margin to prevent noise from causing DATA OUT to erroneously fall below the 1.4 V threshold.

Still referring to FIG. 3, in operation when the optional overdrive modules 68 and 70 are present and the switches 60 and 64 are NMOS transistors, the modules 68 and 70 boost the logic 1 voltage level of $DATA_1$ to an overdrive voltage level that is greater than $V_{DD}$. The overdrive voltage overdrives the gates of the transistors 60 and 64, and thus compensates for the thresholds of these transistors. Therefore, assuming the voltage on the input terminal 46 is $V_{DD}$ when $DATA_1$ is logic 1 (i.e., logic 1=$V_{DD}$), the overdrive voltage allows the transistors 60 and 64 to fully couple $V_{DD}$ (and not a voltage equal to two transistor thresholds below $V_{DD}$) to the output terminal 54 during the first predetermined time. The overdrive modules 68 and 70 are further discussed below in conjunction with FIG. 6.

The second stage 58 operates similarly to the first stage 56. When data to be read from the memory device 26 equals logic 0, the signal $DATA_2$ transitions from logic 0 to logic 1, and thus activates the switch 72. Furthermore, the timer 78 activates the switch 74 for a second predetermined time after the transition of $DATA_2$. After the expiration of the second predetermined time, the timer 78 deactivates the switch 74, which in effect serially couples the impedance 76 between the second supply terminal 52 and the output terminal 54. Thus, during the second predetermined time, the drive current available to discharge the capacitance 55 is relatively high, and thus the transition of DATA OUT from logic 1 to logic 0 is relatively fast. After the expiration of the second predetermined time, which is preferably of a duration sufficient to allow DATA OUT to cross the logic 0 threshold, but not so long to allow DATA OUT to reach the low supply rail, the impedance 76 limits the minimum voltage of DATA OUT as to prevent it from falling all the way to ground. In one aspect of the invention, the logic 0 threshold is 1.4 volts, and the stage 58 limits the minimum voltage of DATA OUT to between approximately 0.8 and 1.2 volts to allow a noise margin of 0.2=0.6 V.

When included, the optional compensation modules 80 and 82 balance the driver 44 by equalizing the delays of the first and second stages 56 and 58. Unlike the first stage 56, the transistors that form the switches 72 and 74 need not be overdriven, because $V_{DD}$ is sufficient to overcome the threshold of these transistors and to drive DATA OUT toward a sufficiently low voltage level during the second predetermined period. However, the modules 80 and 82 compensate for the delay that the modules 68 and 70 add to the first stage 56.

Figure 4:
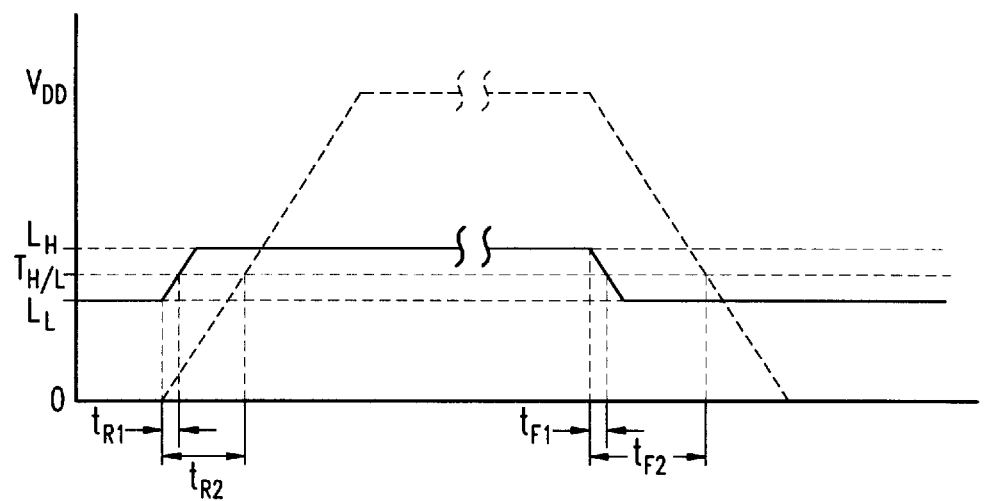
FIG. 4 is a comparison of the output signal of the output driver of FIG. 3 and the output signal of the output driver of FIG. 1.

FIG. 4 is a timing diagram that compares the signal DATA OUT (solid line) of the driver 44 of FIG. 3 to a similar signal (dashed line) generated by the known driver circuit 10 of FIG. 1. For example purposes, the high/low threshold is denoted by $T_{H/L}$, the limited voltage levels of the driver 44 are denoted by $L_H$ and $L_L$, and it is assumed that the circuit 10 and the driver 44 have similar slew rates during the first and second predetermined times that are discussed above in conjunction with FIG. 3. The driver 44 transitions DATA OUT from logic 0, i.e., $L_L$ to logic 1, i.e., $T_{H/L}$ in a time $t_{R1}$. The circuit 10 transitions the conventional output signal from logic 0, i.e., 0 volts, to $T_{H/L}$ in a time $t_{R2}$. It is clear that $t_{R2}$ is significantly longer than $t_{R1}$. The driver 44 transitions DATA OUT from logic 1, i.e., $L_H$ to $T_{H/L}$ in a time $t_{F1}$. The circuit 10 transitions the output signal from logic 1, i.e., $V_{DD}$, to $T_{H/L}$ in a time $t_{F2}$. Again, it is clear that $t_{F2}$ is much greater than $t_{F1}$. Thus, it is clear that the driver 44, by limiting the full-signal swing of DATA OUT, can provide data at a much faster rate than conventional driver circuits such as the circuit 10.

Figure 5:
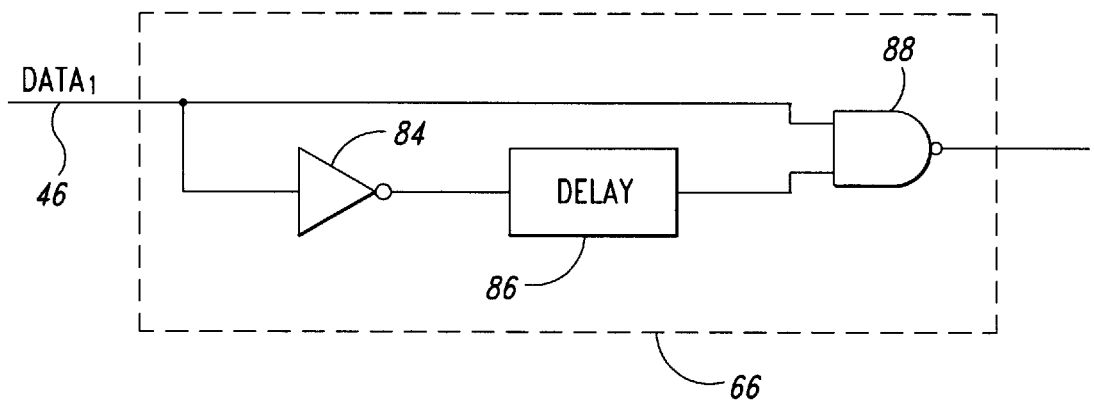
FIG. 5 is a schematic diagram of one embodiment of the timer circuit of FIG. 3.

FIG. 5 is a schematic diagram of one embodiment of the timer circuits 66 and 78 of FIG. 3. For clarity, the circuit of FIG. 5 is labeled as the timer 66, it being understood that a similar or identical circuit can be used for the timer 78. The timer 66 is a monostable multivibrator, which is commonly called a one-shot and generates a logic 0 pulse for the first predetermined time (as discussed above in conjunction with FIG. 3) in response to a transition of $DATA_1$ from an inactive logic 0 to an active logic 1. The timer 66 includes an inverter 84 having an input coupled to the first input terminal 46. A delay circuit 86 has in input that is coupled to the output of the inverter 84. A NAND gate 88 has a first input directly coupled to the first input terminal 46, and has a second input that is coupled to the output of the delay circuit 86.

In operation, when the steady-state value of $DATA_1$ equals logic 0, the first input of the NAND gate 88 is at logic 0, and the second input is at logic 1. Thus, the NAND gate 88 generates logic 1 at its output. When $DATA_1$ transitions to logic 1, then both inputs of the NAND gate 88 are at logic 1, since the logic 0 to logic 1 transition of $DATA_1$ is not immediately coupled through the inverter 84 and the delay 86. Thus the NAND gate 88 generates logic 0 at its output. As soon as the transition of $DATA_1$ propagates through the inverter 84 and the delay circuit 86, the second input of the NAND gate 88 becomes equal to logic 0, and thus the NAND gate 88 returns its output to logic 1. The duration of the logic 0 pulse, and thus the first predetermined time, equals the propagation delay of $DATA_1$ through the inverter 84, the delay 86, and the NAND gate 88.

In one aspect of the invention, the delay circuit 86 has a propagation delay in the range of approximately 2–5 nanoseconds, giving a range of approximately 3–6 nanoseconds for the first predetermined time. Furthermore, because the timer 66 provides a logic 0 pulse, and because the switch 60 requires a logic 1 at its control terminal for activation, the timer circuit 66 is suitable for use with an inverting embodiment of the overdrive module 68 (FIG. 3). Of course, the timer 66 may be modified such that it provides a logic 1 pulse. Such a modified timer 66 is suitable for use in an embodiment of the driver 44 that lacks the overdrive module 68, or incorporates a noninverting overdrive module 68.

Still referring to FIG. 5, in another embodiment of the invention, the timers 66 and 78 may comprise only the delay circuit 86. Thus, in operation and referring to FIG. 3, if $DATA_1$ equals logic 0, then the timer 66, after the delay period of the delay circuit 86, provides at its output logic 0, which the overdrive module 68 inverts into logic 1 to activate the switch 60. However,. $DATA_1$ deactivates the switch 64, and thus no current flows between $V_{DD}$ and the output terminal 54. When $DATA_1$ transitions to logic 1, then both the switches 60 and 64 are active for the first predetermined time, which equals the delay of the delay circuit 86. After the expiration of the first predetermined time, the timer 66 generates at its output logic 1, which the overdrive module 68 inverts to deactivate the switch 60. In one aspect of the invention, the delay circuit 86 has a delay in the range of approximately 3–6 nanoseconds. Of course, the delay circuit 86 may be modified to invert as well as delay $DATA_1$.

Such a modified delay circuit 86 is suitable for use in embodiments of the driver 44 that lack the optional overdrive module 68, or include a noninverting overdrive module 68.

Figure 6A:
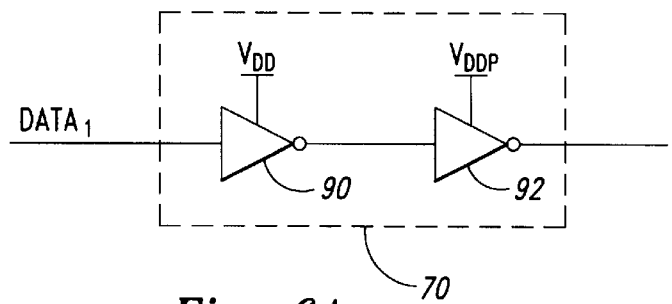
FIG. 6A is a schematic diagram of one embodiment of the first voltage overdrive module of FIG. 3.

FIG. 6A is a schematic diagram of one embodiment of the overdrive module 70 of FIG. 3. The module 70 includes a first inverter 90 that has an input coupled to the first input 46 of the driver 44, and has a power terminal that is coupled to $V_{DD}$. The output of the first inverter 90 is coupled to the input of a second inverter 92, which has a power terminal that is coupled to the charge pump voltage $V_{DDP}$. As discussed above, $V_{DDP}$ is approximately 1 to 1.5 volts greater than $V_{DD}$. For example, if $V_{DD}$=3.3 V, then $V_{DDP}$= 4.3 to 4.8 V.

In operation, if $DATA_1$ equals logic 1, then the overdrive module 70 generates at its output an overdrive voltage of approximately 4.5 volts. The overdrive voltage fully turns on the switch 64 by compensating for the threshold of the transistor that forms the switch 64, and thus allows a maximum voltage to be coupled from the supply terminal 50 to the output terminal 54. The inverter 92 is further discussed below in conjunction with FIG. 7.

Figure 6B:
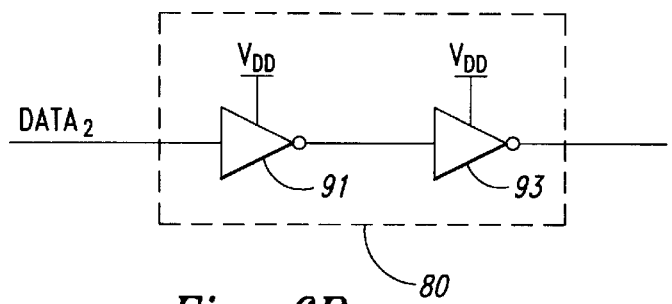
FIG. 6B is a schematic diagram of one embodiment of the first compensation module of FIG. 3.

Referring to FIG. 6B, the compensation module 80 is similar to the overdrive module 70, except that in one embodiment of the invention, the inverter 92 is replaced with an inverter 93, which is similar to the inverter 90. The module 80 includes another inverter 91, which is similar to the inverter 90, and which is serially coupled to the inverter 93. Thus, other than not providing an overdrive voltage, this embodiment of the compensation module 80 operates similarly to the overdrive module 70.

Figure 6C:
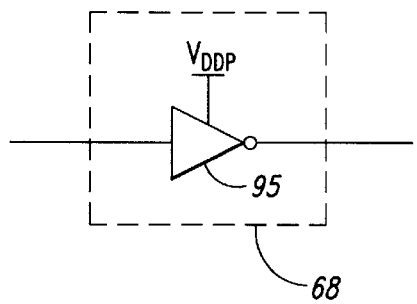
FIG. 6C is a schematic diagram of one embodiment of the second overdrive module of FIG. 3.

Referring to FIG. 6C, the overdrive module 68 includes an inverter 95, which is similar to the inverter 92 and is coupled between the input and output terminals of the module 68. Of course, other embodiments of the module 68 may include an additional serially coupled inverter (not shown) that compensates for the type of timer 66 (inverting or noninverting) used.

Figure 6D:
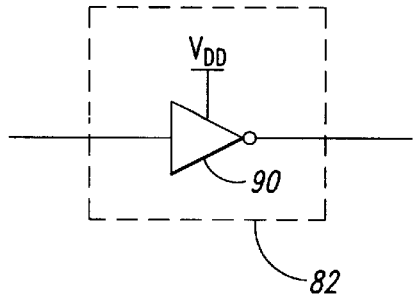
FIG. 6D is a schematic diagram of one embodiment of the second compensation module of FIG. 3.

Referring to FIG. 6D, the compensation module 82 is similar to the overdrive module 68, except that it includes an inverter 97, which is similar to the inverter 90. Of course, the compensation module 82 may include an additional serially coupled inverter (not shown) that compensates for the type of timer 78 (inverting or noninverting) used.

Figure 7:
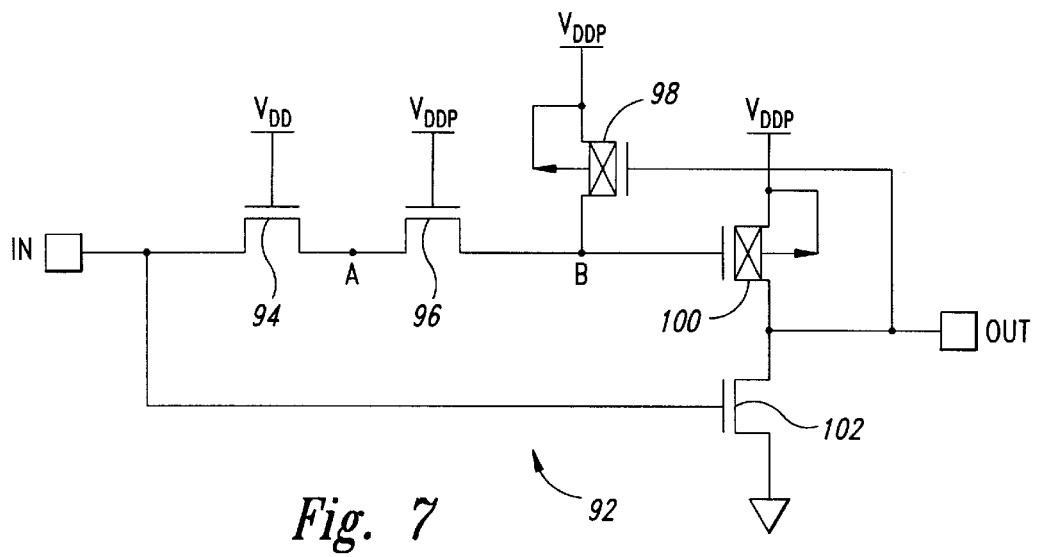
FIG. 7 is a schematic diagram of one embodiment of the overdrive inverter of 6A.

FIG. 7 is a schematic diagram of one embodiment of the inverter 92 of FIG. 6A. The inverter 92 includes an NMOS transistor 94, which has its gate terminal coupled to the supply voltage $V_{DD}$, a first terminal coupled to the input terminal of the inverter 92, and a second terminal coupled to a node A. A second NMOS transistor 96 has its gate coupled to the charge-pump voltage $V_{DDP}$, a first terminal coupled to the node A, and a second terminal coupled to a node B. A PMOS transistor 98 has a source terminal and a bulk terminal coupled to $V_{DDP}$, a drain terminal coupled to the node B, and a gate terminal coupled to the output terminal of the inverter 92. A PMOS transistor 100 has a gate terminal coupled to the node B, a source terminal and a bulk terminal coupled to $V_{DDP}$, and a drain terminal coupled to the output terminal of the inverter 92. An NMOS transistor 102 has a gate coupled to the input terminal of the inverter 92, a drain terminal coupled to the output terminal of the inverter 92, and a source terminal coupled to ground.

In operation, when the signal input to the inverter 92 equals logic 0, the transistor 102 is inactive, and the logic 0 propagates through the active transistors 94 and 96 to the gate of the transistor 100. The logic 0 activates the transistor 100, which then pulls up the output terminal to the voltage $V_{DDP}$, i.e., the overdrive voltage. The output voltage is then fed back to and deactivates the transistor 98. When the input signal equals logic 1, the transistor 102 is active and pulls the output terminal of the inverter 92 down to approximately 0 V. The logic 0 output signal is fed back to and activates the transistor 98, which provides $V_{DDP}$ to the node B and thus deactivates the transistor 100. Because the gate voltage of the transistor 96 also equals $V_{DDP}$, and because of the inherent threshold voltage (typically 1 to 1.5 V) of the transistor 96, the transistor 96 couples a voltage of approximately $V_{DD}$ to the node A. Using a similar analysis, because voltages at the node A and at the input terminal of the inverter 92 are both approximately equal to $V_{DD}$, no current flows through the transistor 94, and thus no signal is fed back to the input of the inverter 92.

Still referring to FIG. 7, in one aspect of the invention, the transistors 94 and 96 have channel widths of approximately 10 microns ($\mu$m) and channel lengths of approximately 1.5 $\mu$m. The channel width of the transistor 98 is approximately 10 $\mu$m, and the channel length is approximately 5 $\mu$m. The channel widths of the transistors 100 and 102 are approximately 1 $\mu$m, and the channel lengths are approximately 1.5 $\mu$m.

Figure 8:
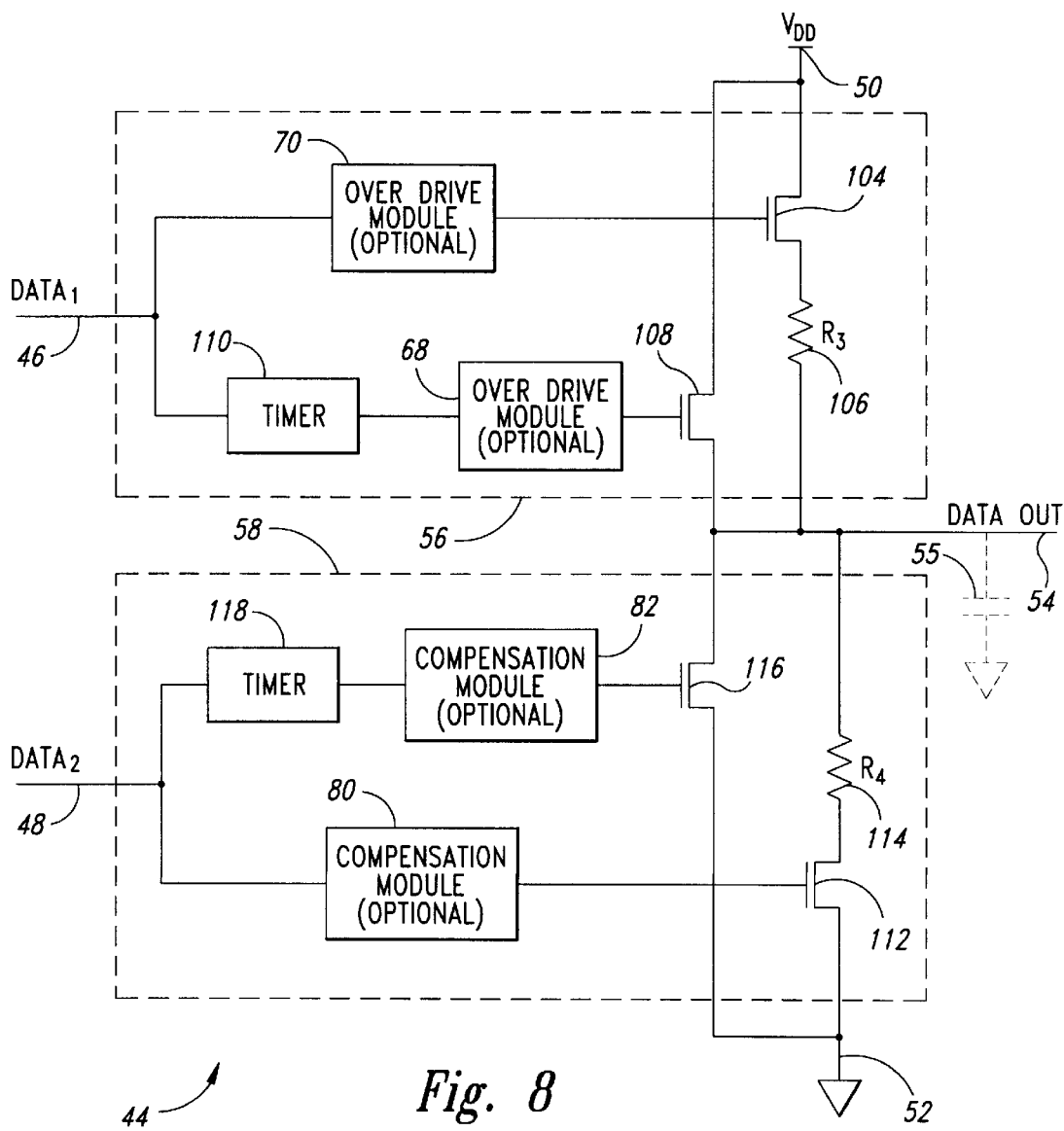
FIG. 8 is a schematic diagram of a second embodiment of the output driver of FIG. 2.

FIG. 8 is a schematic diagram of a second embodiment of an output driver circuit 44 of FIG. 2. The driver 44 includes the first and second input terminals 46 and 48, the first and second supply terminals 50 and 52, the output terminal 54, which is or is connected to an external pin of the memory device 26, and the first and second stages 56 and 58.

The first stage 56 includes a switch 104 that has a first switch terminal coupled to the first supply terminal 50, a control terminal, and a second switch terminal. The second switch terminal of the switch 104 is coupled to a first terminal of an impedance 106, which has a second terminal coupled to the output terminal 54. Thus, the switch 104 and impedance 106 are serially coupled between the first supply terminal 50 and the output terminal 54. A second switch 108 has a first switch terminal coupled to the first supply terminal 50, a second switch terminal coupled to the output terminal 54, and a gate terminal. The optional overdrive module 70 is preferably coupled between the input terminal 46 and a control terminal of the switch 104. A timer circuit 110, and preferably the optional overdrive module 68, are serially coupled between the input terminal 46 and the control terminal of the switch 108. In one embodiment of the invention, the switches 104 and 108 are NMOS transistors, and the impedance 106 is a resistor having a resistance value $R_3$.

The second stage 58 includes a third switch 112, which has a first switch terminal coupled to the first terminal of an impedance 114, a second switch terminal coupled to the second supply terminal 52, and a control terminal. The impedance 114 has a second terminal coupled to the output terminal 54. A switch 116 has a first switch terminal coupled to the output terminal 54, a second switch terminal coupled to the second supply terminal 52, and a control terminal. The optional compensation module 80 is preferably serially coupled between the input terminal 48 and the control terminal of the switch 112. A timer circuit 118, and preferably the optional compensation module 82, are serially coupled between the input terminal 48 and the control terminal of the switch 116. In one embodiment of the invention, the switches 112 and 116 are NMOS transistors, and the impedance 114 is a resistor having a resistance value $R_4$, which in one aspect of the invention, is approximately equal to $R_3$.

In operation, if DATA₁ and DATA₂ have steady state values of logic 0, all four switches 104, 108, 112, and 116 are inactive. Thus, the driver 44 allows the output terminal 54 to float electrically. If DATA₁ equals logic 1 and DATA₂ equals logic 0 to represent a data value equal to logic 1, then the stage 58 deactivates the switches 116 and 112. When DATA₁ transitions to a logic 1, the switch 104 is active, and the timer 110 activates the switch 108 for a first predetermined time after DATA₁ transitions to logic 1. The switch 108, which is coupled directly between $V_{DD}$ and the output terminal 54, charges the capacitance 55 relatively quickly such that DATA OUT quickly transitions from logic 0 to logic 1. After the expiration of the first predetermined time, which in one aspect of the invention is sufficient to allow the switch 108 to drive the output signal to just beyond the logic 1 threshold, the timer 110 deactivates the switch 108. Thus, the only path between $V_{DD}$ and the output terminal 54 is through the active switch 104 and the impedance 106. Therefore, after the first predetermined time, the stage 56 limits the maximum level of DATA OUT to a value below $V_{DD}$ as discussed above in conjunction with FIG. 3.

If DATA₁ transitions to logic 0 and DATA₂ transitions to logic 1 to represent a data value of logic 0, DATA₁ deactivates the switches 104 and 108, which thus provide no signal to the output terminal 54. The signal DATA₂ activates the switch 112, and the timer 118 activates the switch 116 for a second predetermined time after DATA₂ transitions to logic 1. During the second predetermined time, the switch 116, which is serially coupled directly between ground and the output terminal 54, rapidly discharges the capacitance 55, and thus rapidly transitions DATA OUT from logic 1 to logic 0. After the expiration of the second predetermined time, which in one aspect of the invention is sufficiently long to allow the switch 116 to drive DATA OUT to just below the logic 0 threshold, the timer 118 deactivates the switch 116. Thus, the only path between ground and the output terminal 54 is through the impedance 114 via the switch 112. Therefore, the output stage 58 limits the minimum value of DATA OUT to a value above ground as discussed above in conjunction with FIG. 3.

Still referring to FIG. 8, when the stages 56 and 58 include the optional modules 68, 70, 80 and 82, respectively, the driver 44 operates in a similar manner except that the modules 68 and 70 provide overdrive voltages to the switches 104 and 108, and the modules 80 and 82 introduce to the stage 58 delays that compensate for the delays that the modules 68 and 70 introduce to the stage 56.

In one aspect of the invention, the timers 110 and 118 are the one-shot circuit 66 shown in FIG. 5. In such an aspect of the invention, the overdrive module 68 provides an inversion to offset the inversion provided by the timer 110, and the compensation module 82 provides an inversion to offset the inversion provided by the timer 118.

Figure 9:
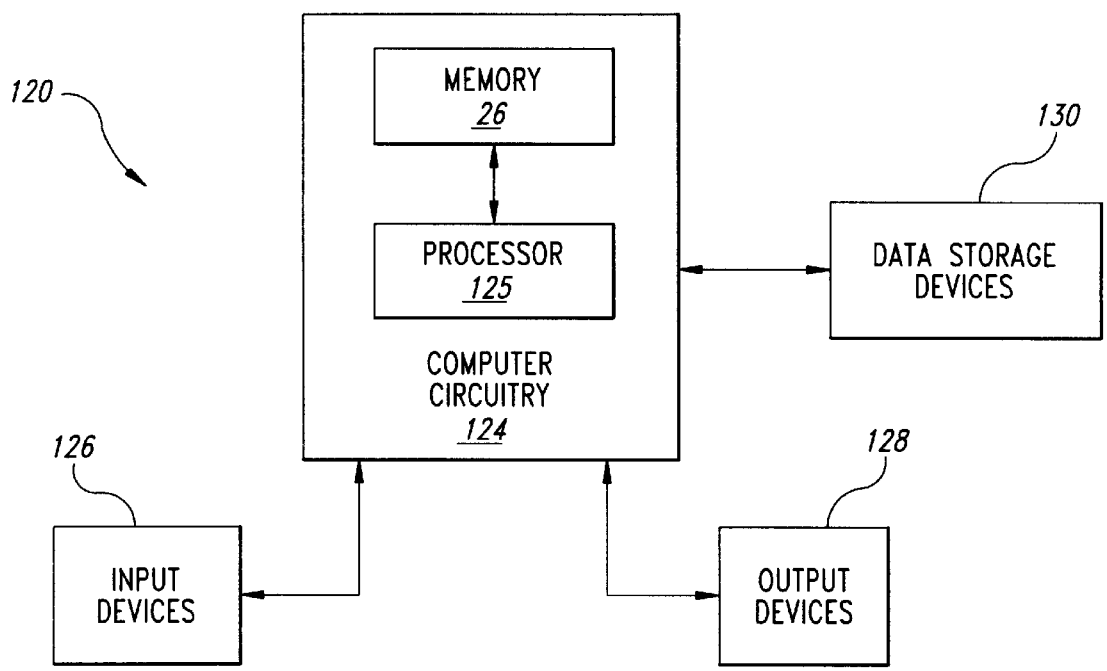
FIG. 9 is a block diagram of a computer system according to the present invention.

FIG. 9 is a block diagram of a computer system 120, which incorporates the memory device 26 of FIG. 2. The computer system 120 includes computer circuitry 124 for performing computer functions, such as executing software to perform desired calculations and tasks. The circuitry 124 typically includes a processor 125 that is coupled to the memory device 26. One or more input devices 126, such as a keypad or a mouse, are coupled to the computer circuitry 124 and allow an operator (not shown) to manually input data thereto. One or more output devices 128 are coupled to the computer circuitry 124 to provide to the operator data generated by the computer circuitry 124. Examples of such output devices 128 include a printer and a video display unit. One or more data-storage devices 130 are coupled to the computer circuitry 124 to store data on or retrieve data from external storage media (not shown). Examples of the storage devices 130 and the corresponding storage media include drives that accept hard and floppy disks, tape cassettes, and compact disc read-only memories (CD-ROMs). Typically, the computer circuitry 124 includes address, data, and command buses and a clock line that are respectively coupled to the ADDRESS, DATA, and COMMAND BUSES, and the CLK line of the memory 26 via the address, data, command, and clock pins of the memory device 26.

From the foregoing it will be appreciated that, although specific embodiments of the invention have been described herein for purposes of illustration, various modifications may be made without deviating from the spirit and scope of the invention. For example, referring to FIGS. 3 and 8, the first, second, third and fourth switches, although described as including MOS-type transistors, may include bipolar transistors or other types of switches. Furthermore, the relative positions of the switch 104 and impedance 106 (FIG. 8), and the switch 112 and the impedance 114 may be reversed without affecting the operation of the device 44. Similarly, the positions of the switches 60 and 64 (FIG. 3) and 72 and 74 may also be reversed without affecting the operation of the device 44. Additionally, a driver 44 may have a single stage according to the invention, or may have two stages with only one in accordance with the invention. Such a driver would limit the swing of the output signal in only one direction. Accordingly, the invention is not limited except as by the appended claims.

We claim:

1. A circuit that converts first and second input signals having first and second active levels, respectively, into an output signal, the circuit comprising:

first and second input terminals operable to receive said first and second input signals;

an output terminal operable to provide said output signal;

first and second drive terminals;

a first stage that is coupled to said first input terminal, said first drive terminal, and said output terminal, said first stage operable to couple a first impedance between said first drive terminal and said output terminal when said first input signal is at said first active level, said first stage operable to reduce the magnitude of said first impedance for a first predetermined time after said first input signal transitions to said first active level; and a second stage that is coupled to said second input terminal, said second drive terminal, and said output terminal, said second stage operable to couple a second impedance between said second drive terminal and said output terminal when said second input signal is at said second active level.

2. The circuit of claim 1 wherein said first impedance approximately equals said second impedance.

3. A circuit that converts first and second input signals having first and second active levels, respectively, into an output signal, the circuit comprising:

first and second input terminals operable to receive said first and second input signals;

an output terminal operable to provide said output signal;

first and second supply terminals;

a first stage that is coupled to said first input terminal, said first supply terminal, and said output terminal, said first stage operable to couple a first impedance between said first supply terminal and said output terminal when said first input signal is at said first active level, said first stage operable to reduce the magnitude of said first impedance for a first predetermined time after said first input signal transitions to said first active level; and a second stage that is coupled to said second input terminal, said second supply terminal, and said output terminal, said second stage operable to couple a second impedance between said second supply terminal and said output terminal when said second input signal is at said second active level, said second stage operable to reduce the magnitude of said second impedance for a second predetermined time after said second data signal transitions to said second active level.

4. The circuit of claim 3 wherein said first and second stages are each operable to respectively reduce said magnitudes of said first and second impedances to less than 100 ohms.

5. A circuit that converts first and second input signals having first and second active levels, respectively, into an output signal, the circuit comprising:

first and second input terminals;

an output terminal;

first and second supply terminals;

a first switch having a control terminal, a first switch terminal coupled to said first supply terminal, and a second switch terminal;

a second switch having a control terminal coupled to said first input terminal, a first switch terminal coupled to said second switch terminal of said first switch, and a second switch terminal coupled to said output node;

a third switch having a control terminal coupled to said second input terminal, a first switch terminal coupled to said output node, and a second switch terminal;

a fourth switch having a control terminal, a first switch terminal coupled to said second switch terminal of said third switch, and a second switch terminal coupled to said second supply terminal;

a first load coupled in parallel with said first switch;

a second load coupled in parallel with said fourth switch;

a first timer having an input terminal coupled to said first input terminal and having an output terminal coupled to said control terminal of said first switch, said first timer operable to activate said first switch for a first predetermined time after said first input signal transitions to said first active level; and a second timer having an input terminal coupled to said second input terminal and having an output terminal coupled to said control terminal of said fourth switch, said second timer operable to activate said fourth switch for a second predetermined time after said second input signal transitions to said second active level.

6. The circuit of claim 5 wherein:

said first timer comprises a first monostable circuit coupled between said input terminal and said output terminal of said first timer, said first monostable circuit operable to generate a pulse having a duration equal to said first predetermined time; and said second timer comprises a second monostable circuit coupled between said input terminal and said output terminal of said second timer, said second monostable circuit operable to generate a pulse having a duration equal to said second predetermined time.

7. The circuit of claim 5 wherein:

said first timer comprises a first delay circuit coupled between said input terminal and said output terminal of said first timer, said first delay circuit operable to delay said first input signal for said first predetermined time; and said second timer comprises a second delay circuit coupled between said input terminal and said output terminal of said second timer, said second delay circuit operable to delay said second input signal for said second predetermined time.

8. The circuit of claim 5, further comprising:

a third supply terminal;

a first overdrive module coupled between said output terminal of said first timer and said control terminal of said first switch, said first overdrive module having a power terminal coupled to said third supply terminal;

a second overdrive module coupled between said first input terminal and said control terminal of said second switch, said second overdrive module having A power terminal coupled to said third supply terminal;

wherein said first supply terminal is coupled to receive a first supply voltage; and wherein said third supply terminal is coupled to receive a second supply voltage that is greater than said first voltage.

9. The circuit of claim 8 wherein said first and second overdrive modules each comprise an inverter coupled between said output terminal of said respective first and second timer and said control terminal of said respective first and fourth transistor, said inverter having a power terminal coupled to said third supply terminal.

10. A circuit that converts first and second input signals into an output signal, the circuit comprising:

first and second input terminals operable to receive said first and second input signals;

an output terminal operable to provide said output signal;

first and second supply terminals;

a first switch having a control terminal, a first switch terminal coupled to said first supply terminal, and a second switch terminal coupled to said output terminal;

a second switch having a control terminal coupled to said first input terminal, a first switch terminal coupled to said first supply terminal, and a second switch terminal;

a third switch having a control terminal, a first switch terminal coupled to said output node, and a second switch terminal coupled to said second supply terminal;

a fourth switch having a control terminal coupled to said second input terminal, a first switch terminal, and a second switch terminal coupled to said second supply terminal;

a first load serially coupled between said second switch terminal of said second switch and said output terminal;

a second load serially coupled between said first switch terminal of said fourth switch and said output terminal;

a first timer having an input terminal coupled to said first input terminal and having an output terminal coupled to said control terminal of said first switch, said first timer operable to activate said first switch for a first predetermined time after said first input signal transitions to said first active level; and a second timer having an input terminal coupled to said second input terminal and having an output terminal coupled to said control terminal of said third switch, said second timer operable to activate said third switch for a second predetermined time after said second input signal transitions to said second active level.

11. The circuit of claim 10 wherein:

said first timer comprises a first monostable circuit coupled between said input terminal and said output terminal of said first timer, said first monostable circuit operable to generate a pulse having a duration equal to said first predetermined time; and said second timer comprises a second monostable circuit coupled between said input terminal and said output terminal of said second timer, said second monostable circuit operable to generate a pulse having a duration equal to said second predetermined time.

12. The circuit of claim 10, further comprising:

a third supply terminal;

a first overdrive module coupled between said output terminal of said first timer and said control terminal of said first switch, said first overdrive module having a power terminal coupled to said third supply terminal;

a second overdrive module coupled between said first input terminal and said control terminal of said second switch, said second overdrive module having a power terminal coupled to said third supply terminal;

wherein said first supply terminal is coupled to receive a first supply voltage; and wherein said third supply terminal is coupled to receive a second supply voltage that is greater than said first voltage.

13. The circuit of claim 10 wherein said first, second, third, and fourth switches each comprise an n-channel transistor.

14. A memory device, comprising:

first and second supply terminals;

address, data, and command busses;

a data pin coupled to said data bus;

a bank of memory cells;

an address decoder coupled to said address bus and said memory bank;

a control circuit coupled to said command bus and to said address decoder;

a read/write circuit coupled to said address decoder, control circuit, and memory bank, said read/write circuit operable to generate during a read cycle first and second data signals having first and second active levels respectively; and a data input/output circuit coupled to said data bus, read/write circuit, and control circuit, said data input/output circuit including a data output driver that includes, first and second input terminals coupled to said read/write circuit, an output terminal coupled to said data pin via said data bus, a first driver stage that is coupled to said first input terminal, said first supply terminal, and said output terminal, said first stage operable to couple a first impedance between said first supply terminal and said output terminal when said first data signal is at said first active level, said first stage operable to reduce the magnitude of said first impedance for a first predetermined time after said first data signal transitions to said first active level, and a second stage that is coupled to said second input terminal, said second supply terminal, and said output terminal, said second stage operable to couple a second impedance between said second supply terminal and said output terminal when said second data signal is at said second active level, said second stage operable to reduce the magnitude of said second impedance for a second predetermined time after said second data signal transitions to said second active level.

15. The memory device of claim 14 wherein:

said first stage comprises, a first switch having a control terminal, a first switch terminal coupled to said first supply terminal, and a second switch terminal, a second switch having a control terminal coupled to said first input terminal, a first switch terminal coupled to said second switch terminal of said first switch, and a second switch terminal coupled to said output node, a first load shunting said first switch, and a first timer having an input terminal coupled to said first input terminal and having an output terminal coupled to said control terminal of said first switch, said first timer operable to activate said first switch for said first predetermined time; and said second stage comprises, a third switch having a control terminal coupled to said second input terminal, a first switch terminal coupled to said output node, and a second switch terminal, a fourth switch having a control terminal, a first switch terminal coupled to said second switch terminal of said third switch, and a second switch terminal coupled to said second supply terminal, a second load shunting said fourth switch, and a second timer having an input terminal coupled to said second input terminal and having an output terminal coupled to said control terminal of said fourth switch, said second timer operable to activate said fourth switch for said second predetermined time.

16. The memory device of claim 15 wherein:

said first timer comprises a first one-shot device coupled between said input terminal and said output terminal of said first timer, said first one-shot device operable to generate a pulse having a duration equal to said first predetermined time; and said second timer comprises a second one-shot device coupled between said input terminal and said output terminal of said second timer, said second one-shot device operable to generate a pulse having a duration equal to said second predetermined time.

17. The memory device of claim 15 wherein:

said first timer comprises a first delay circuit coupled between said input terminal and said output terminal of said first timer, said first delay circuit operable to delay said data input signal for said first predetermined time; and said second timer comprises a second delay circuit coupled between said input terminal and said output terminal of said second timer, said second delay circuit operable to delay said data-complement signal for said second predetermined time.

18. The memory device of claim 15, further comprising:

a charge pump having an input terminal coupled to said first supply terminal and having an output terminal; and wherein said first stage comprises, a first overdrive module coupled between said output terminal of said first timer and said control terminal of said first switch, said first module having a power terminal coupled to said output terminal of said charge pump, and a second overdrive module coupled between said first input terminal and said control terminal of said second switch, said second module having a power terminal coupled to said output terminal of said charge pump.

19. The memory device of claim 14 wherein:

said first stage comprises,
- a first switch having a control terminal, a first switch terminal coupled to said first supply terminal, and a second switch terminal coupled to said output terminal,
- a second switch having a control terminal coupled to said first input terminal, a first switch terminal coupled to said first supply terminal, and a second switch terminal,
- a first load serially coupled between said second switch terminal of said second switch and said output terminal, and
- a first timer having an input terminal coupled to said first input terminal and having an output terminal coupled to said control terminal of said first switch, said first timer operable to activate said first switch for said first predetermined time, and said second stage comprises,
- a third switch having a control terminal, a first switch terminal coupled to said output node, and a second switch terminal coupled to said second supply terminal,
- a fourth switch having a control terminal coupled to said second input terminal, a first switch terminal, and a second switch terminal coupled to said second supply terminal,
- a second load serially coupled between said first switch terminal of said fourth switch and said output terminal, and
- a second timer having an input terminal coupled to said second input terminal and having an output terminal coupled to said control terminal of said third switch, said second timer operable to activate said third switch for said second predetermined time.

20. The memory device of claim 19 wherein:

said first timer comprises a first pulse generator circuit coupled between said input terminal and said output terminal of said first timer, said first pulse generator operable to generate a pulse having a duration equal to said first predetermined time; and said second timer comprises a second pulse generator coupled between said input terminal and said output terminal of said second timer, said second pulse generator operable to generate a pulse having a duration equal to said second predetermined time.

21. The memory device of claim 19 wherein said first, second, third, and fourth switches each comprise an n-channel transistor.

22. A computer system, comprising:

a data input device;

a data output device; and computing circuitry coupled to said data input and output devices, said computing circuitry including a memory device that includes,
- first and second supply terminals,
- address, data, and command busses,
- a data pin coupled to said data bus,
- a bank of memory cells,
- an address decoder coupled to said address bus and said memory bank,
- a control circuit coupled to said command bus and to said address decoder,
- a read/write circuit coupled to said address decoder, control circuit, and memory bank, said read/write circuit operable to generate during a read cycle first and second data signals having first and second active levels respectively, and
- a data input/output circuit coupled to said data bus, read/write circuit, and control circuit, said data input/output circuit including a data output driver that includes,
  - first and second input terminals coupled to said read/write circuit,
  - an output terminal coupled to said data pin via said data bus,
  - a first driver stage that is coupled to said first input terminal, said first supply terminal, and said output terminal, said first stage operable to couple a first impedance between said first supply terminal and said output terminal when said first data signal is at said first active level, said first stage operable to reduce the magnitude of said first impedance for a first predetermined time after said first data signal transitions to said first active level, and
  - a second stage that is coupled to said second input terminal, said second supply terminal, and said output terminal, said second stage operable to couple a second impedance between said second supply terminal and said output terminal when said second data signal is at said second active level, said second stage operable to reduce the magnitude of said second impedance for a second predetermined time after said second data signal transitions to said second active level.

23. The computer system of claim 22 wherein:

said first stage comprises,
- a first switch having a control terminal, a first switch terminal coupled to said first supply terminal, and a second switch terminal,
- a second switch having a control terminal coupled to said first input terminal, a first switch terminal coupled to said second switch terminal of said first switch, and a second switch terminal coupled to said output node,
- a first load shunting said first switch, and
- a first timer having an input terminal coupled to said first input terminal and having an output terminal coupled to said control terminal of said first switch, said first timer operable to activate said first switch for said first predetermined time; and said second stage comprises,
- a third switch having a control terminal coupled to said second input terminal, a first switch terminal coupled to said output node, and a second switch terminal,
- a fourth switch having a control terminal, a first switch terminal coupled to said second switch terminal of said third switch, and a second switch terminal coupled to said second supply terminal,
- a second load shunting said fourth switch, and
- a second timer having an input terminal coupled to said second input terminal and having an output terminal coupled to said control terminal of said fourth switch, said second timer operable to activate said fourth switch for said second predetermined time.

24. The computer system of claim 22 wherein:

said first stage comprises,
- a first switch having a control terminal, a first switch terminal coupled to said first supply terminal, and a second switch terminal coupled to said output terminal, a second switch having a control terminal coupled to said first input terminal, a first switch terminal coupled to said first supply terminal, and a second switch terminal, a first load serially coupled between said second switch terminal of said second switch and said output terminal, and a first timer having an input terminal coupled to said first input terminal and having an output terminal coupled to said control terminal of said first switch, said first timer operable to activate said first switch for said first predetermined time; and said second stage comprises, a third switch having a control terminal, a first switch terminal coupled to said output node, and a second switch terminal coupled to said second supply terminal, a fourth switch having a control terminal coupled to said second input terminal, a first switch terminal, and a second switch terminal coupled to said second supply terminal, a second load serially coupled between said first switch terminal of said fourth switch and said output terminal, and a second timer having an input terminal coupled to said second input terminal and having an output terminal coupled to said control terminal of said third switch, said second timer operable to activate said third switch for said second predetermined time.

25. A method for driving a node with an output signal, comprising:

receiving a first input signal having a first active level;

receiving a second input signal having a second active level;

coupling a first drive signal to said node through a first impedance when said first input signal is at said first active level;

coupling a second drive signal to said node through a second impedance when said second input signal is at said second active level; and increasing the magnitude of said second impedance at a first predetermined time after said second input signal attains said second active level.

26. The method of claim 25 wherein said coupling a second drive signal and said increasing the magnitude comprise enabling first and second parallel electrical paths between said second drive signal and said node during said first predetermined time, and disabling one of said first and second paths after said first predetermined time expires.

27. The method of claim 25, further comprising increasing the magnitude of said first impedance at a second predetermined time after said first input signal attains said first active level.

28. The method of claim 25, further comprising:

increasing the magnitude of said first impedance at a second predetermined time after said first input signal attains said first active level;

wherein said coupling a first drive signal and said increasing the magnitude of said first impedance include enabling first and second parallel electrical paths between said first drive signal and said node during said second predetermined time, and disabling one of said first and second paths after said second predetermined time expires; and wherein said coupling a second drive signal and said increasing the magnitude of said second impedance include enabling third and fourth parallel electrical paths between said second drive signal and said node during said first predetermined time, and disabling one of said third and fourth paths after said first predetermined time expires.

* * * * *

UNITED STATES PATENT AND TRADEMARK OFFICE
CERTIFICATE OF CORRECTION

PATENT NO. : 5,805,505
DATED : September 8, 1998
INVENTOR(S) : Zheng et al.

It is certified that error appears in the above-identified patent and that said Letters Patent is hereby corrected as shown below:

Column 14, line 18          "having A power"          -- a power --

Signed and Sealed this

Twenty-ninth Day of May, 2001

Attest:

NICHOLAS P. GODICI

*Attesting Officer*      *Acting Director of the United States Patent and Trademark Office*